(12) United States Patent
Lorenz et al.

(10) Patent No.: US 10,570,007 B2
(45) Date of Patent: Feb. 25, 2020

(54) MEMS ASSEMBLY AND METHOD FOR PRODUCING A MEMS ASSEMBLY

(71) Applicant: Infineon Technologies AG, Neubiberg (DE)

(72) Inventors: Gunar Lorenz, Munich (DE); Bernd Goller, Otterfing (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/385,475

(22) Filed: Apr. 16, 2019

(65) Prior Publication Data

US 2019/0359481 A1    Nov. 28, 2019

(30) Foreign Application Priority Data

May 24, 2018    (DE) .................. 10 2018 208 230

(51) Int. Cl.
*H04R 19/00* (2006.01)
*B81B 7/00* (2006.01)
*B81C 1/00* (2006.01)
*H04R 19/04* (2006.01)

(52) U.S. Cl.
CPC ............ *B81B 7/007* (2013.01); *B81B 7/0061* (2013.01); *B81B 7/0064* (2013.01); *B81C 1/00301* (2013.01); *B81C 1/00309* (2013.01); *H04R 19/04* (2013.01); *B81B 2201/0257* (2013.01); *B81B 2203/0127* (2013.01); *B81B 2207/012* (2013.01); *B81B 2207/03* (2013.01); *B81C 2203/0792* (2013.01); *H04R 2201/003* (2013.01)

(58) Field of Classification Search
CPC ........ H04R 19/04; H04R 19/005; H04R 1/04; H04R 1/06; H04R 2201/003
See application file for complete search history.

(56) References Cited

U.S. PATENT DOCUMENTS

| | | | |
|---|---|---|---|
| 8,804,982 B2 * | 8/2014 | Michel | H04R 19/04 381/111 |
| 9,432,759 B2 * | 8/2016 | Elian | H04R 1/083 |
| 10,123,112 B2 * | 11/2018 | Murgia | H04R 3/005 |
| 2009/0218668 A1 | 9/2009 | Zhe et al. | |
| 2011/0075875 A1 * | 3/2011 | Wu | B81C 1/0023 381/361 |

(Continued)

FOREIGN PATENT DOCUMENTS

| | | |
|---|---|---|
| EP | 3432604 A1 | 1/2019 |
| JP | 2016072959 A | 5/2016 |
| WO | 2006085825 A1 | 8/2006 |

*Primary Examiner* — Matthew A Eason
(74) *Attorney, Agent, or Firm* — Slater Matsil, LLP

(57) ABSTRACT

A MEMS assembly includes a package, wherein the package includes a substrate and a cover element, wherein a through opening is provided in the cover element, a MEMS component within the package on the cover element, an integrated circuit arrangement within the package on the substrate, and a support component within the package on the substrate, wherein the support component on the substrate is electrically coupled, by first electrical connection lines, to the MEMS component on the cover element and is electrically coupled, by second electrical connection lines, to the circuit arrangement on the substrate in order to produce an electrical connection between the MEMS component and the integrated circuit arrangement.

20 Claims, 5 Drawing Sheets

(56) References Cited

U.S. PATENT DOCUMENTS

| | | | |
|---|---|---|---|
| 2011/0293128 A1* | 12/2011 | Kuratani | B81B 7/0064 |
| | | | 381/361 |
| 2013/0343590 A1* | 12/2013 | Nakagawa | H04R 1/04 |
| | | | 381/361 |
| 2015/0315014 A1* | 11/2015 | Protheroe | B81C 1/00269 |
| | | | 257/416 |

* cited by examiner

MEMS ASSEMBLY AND METHOD FOR PRODUCING A MEMS ASSEMBLY

This application claims the benefit of German Application No. 102018208230.8, filed on May 24, 2018, which application is hereby incorporated herein by reference.

TECHNICAL FIELD

Exemplary embodiments relate to a MEMS assembly or MEMS sensor and to a method for producing same. In particular, exemplary embodiments relate to a MEMS assembly in the form of a MEMS sound transducer, such as e.g. a MEMS microphone, comprising a so-called top port microphone arrangement.

BACKGROUND

MEMS assemblies generally comprise an electrical component arranged on a substrate, e.g. a MEMS component (MEMS=Microelectromechanical System), which is surrounded by a package. The package is intended to protect the MEMS assembly against external ambient influences, such as e.g. dust, dirt, moisture, etc. Some packages are also provided for shielding the MEMS assembly against external electromagnetic radiation, wherein a metallic lid of the package is often used for this purpose.

In the case of MEMS microphones, typically two different types of MEMS assemblies are currently used, i.e. so-called top port microphones and bottom port microphones. In the case of bottom port microphones, sound waves enter the internal volume of the MEMS assembly through a through opening or sound port in the substrate, while in the case of so-called top port microphones, the through opening or sound port is arranged in the lid of the package. In the field of microphones, and in particular high-performance microphones, a high-impedance electrical path between the MEMS assembly and the associated circuit arrangement ASIC (ASIC=Application-Specific Integrated Circuit) is required. Any undesired parasitic capacitances with respect to ground reduce the sensitivity of the MEMS microphone and thus the overall behavior or the overall performance of a MEMS microphone.

In the field of high-performance MEMS microphones there is thus a need for MEMS microphone assemblies having an increased sensitivity and improved operating properties.

Such a need can be met by the subject matter of the present independent patent claims. Developments of the present concept are defined in the dependent claims.

SUMMARY

A MEMS assembly 100 comprises a package 102, wherein the package 102 comprises a substrate 104 and a cover element 106 arranged thereon, wherein a through opening 108 is provided in the cover element 106, a MEMS component 110 arranged within the package 102 on the cover element 106, an integrated circuit arrangement 112 arranged within the package 102 on the substrate 104, and a support component 114 arranged within the package 102 on the substrate 104, wherein the support component 114 arranged on the substrate 104 is electrically coupled, by first electrical connection lines 116, to the MEMS component 110 arranged on the cover element 106 and is furthermore electrically coupled, by second electrical connection lines 118, to the circuit arrangement 112 arranged on the substrate 104 in order to produce an electrical connection between the MEMS component 110 and the integrated circuit arrangement 112.

In accordance with one exemplary embodiment, contact pads 114-1 are arranged on a surface region 114-A of the support component 114 that is situated opposite a surface region 110-A of the MEMS component 110, said contact pads being configured at least regionally in a mirror-inverted fashion with respect to the contact connection pads 110-1 arranged on the surface region 110-A of the MEMS component 110.

In accordance with one exemplary embodiment, the first electrical connection lines 116 between the contact connection pads 110-1 on the MEMS component 110 and the assigned contact pads 114-1 on the support component 114 comprise bond wires or metal pins.

In accordance with one exemplary embodiment, the support component 114 is configured as a wiring bridge between the MEMS component 110 and the integrated circuit arrangement 112.

A method 200 for producing a MEMS assembly 100 comprises the following steps: providing 210 a cover element 106 provided with a through opening 108, wherein a MEMS component 110 is arranged on the cover element 106, providing a substrate 104, wherein an integrated circuit arrangement 112 and a support component 114 are arranged on the substrate 104, wherein the integrated circuit arrangement 112 is electrically coupled to the support component 114 via second electrical connection elements 118, and connecting 230 the cover element 106 to the substrate 104 in order to form a package 102 having an internal volume V and in order to produce an electrical connection between the MEMS component 110 and the support component 114 in the internal volume V via first electrical connection elements 116, wherein the support component 114 arranged on the substrate 104 is electrically coupled, by the first electrical connection elements, to the MEMS component arranged on the cover element 106, and wherein the support component 114 is furthermore electrically coupled, by the second electrical connection elements 118, to the integrated circuit arrangement 112 arranged on the substrate 104 in order to provide an electrical connection between the MEMS component 110 and the integrated circuit arrangement 112.

In accordance with one exemplary embodiment, the method 200 furthermore comprises the following step before the step of connecting 230, aligning contact pads 114-1 on the support component 114 at least regionally opposite contact connection pads 110-1 on the MEMS component 110, wherein the contact pads 114-1 on the support component 114 are arranged at least regionally in a mirror-inverted manner with respect to the contact connection pads 110-1 arranged on the MEMS component 110.

In accordance with one exemplary embodiment, in the step of connecting 230, the electrical coupling between the contact connection pads 110-1 on the MEMS component 110 and the assigned contact pads 114-1 on the support component 114 is obtained by bond wires or metal pins.

In accordance with one exemplary embodiment, the support component 114 is configured as a wiring bridge between the MEMS component 110 and the integrated circuit arrangement 112.

BRIEF DESCRIPTION OF THE DRAWINGS

Exemplary embodiments of the present concept in the form of the described MEMS assembly and the method for producing the MEMS assembly are described in greater detail below by way of example with reference to the accompanying figures and drawings, in which.

DETAILED DESCRIPTION OF ILLUSTRATIVE EMBODIMENTS

Before exemplary embodiments of the present concept are explained more specifically in detail below with reference to the figures, it is pointed out that identical, functionally identical or identically acting elements, objects, and function blocks and/or method steps are provided with the same reference signs in the various figures, such that the description of said elements, objects, function blocks and/or method steps that is presented in the various exemplary embodiments is mutually interchangeable or can be applied to one another.

Various exemplary embodiments will now be described thoroughly with reference to the accompanying figures illustrating the present concept. In the figures, the thicknesses of lines, layers and/or regions of the various elements, objects, function blocks and/or method steps may be illustrated in a manner not to scale for elucidation purposes.

A MEMS assembly 100 in accordance with one exemplary embodiment will now be described below with reference to FIG. 1 in the form of a basic illustration in a cross-sectional view.

Figure 1:
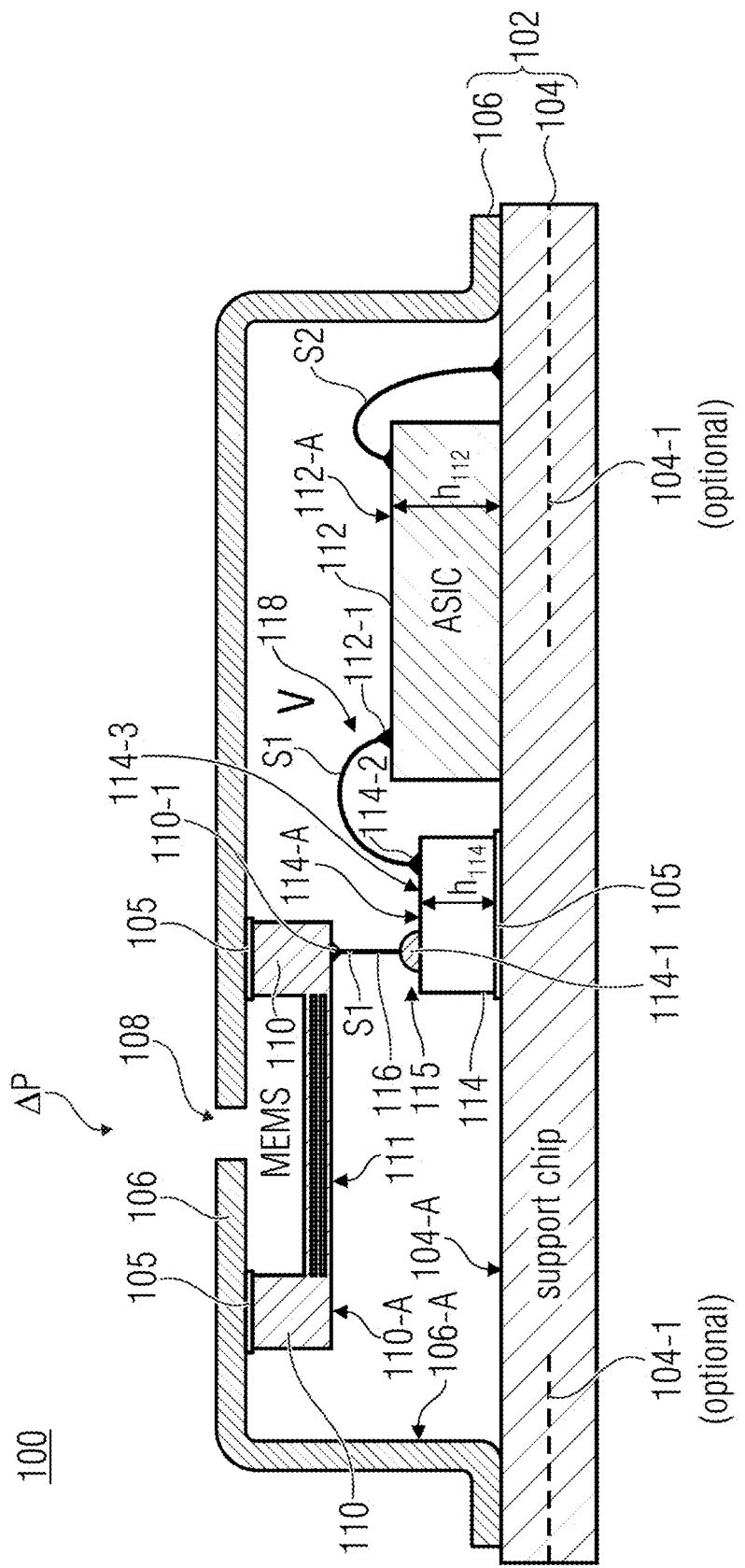
FIG. 1 shows a basic illustration in a cross-sectional view of a MEMS assembly comprising a support component (also called: support chip) in accordance with one exemplary embodiment.

As is illustrated in FIG. 1, the MEMS assembly 100 comprises a package 102 having an internal volume V, wherein the package 102 comprises a substrate 104 and a cover element 106 arranged thereon, which cover element can also be referred to as a lid, for example. In the cover element 106 there is then provided a through opening or sound port 108, also referred to as sound port to the internal volume V. A MEMS component 110 is arranged within the package 102 in the internal volume V on the cover element 106 e.g. adjacent to the through opening 108. Within the package 102, an integrated circuit arrangement 112, also referred to as ASIC (ASIC=Application-Specific Integrated Circuit) 112, is furthermore arranged on the substrate 104. On the substrate 104, a support component 114, which can also be referred to as support assembly or support chip, is furthermore arranged within the package 102 in the internal volume V. The support component 114 arranged on the substrate 104 is then electrically coupled, by first connection lines 116, which can also be referred to as bond wires or bond pins, to the MEMS component 110 arranged on the cover element 106 and is furthermore electrically coupled, by second connection lines 118, to the circuit arrangement 112 arranged on the substrate 104 in order to provide an electrical connection between the MEMS component 110 and the circuit arrangement 112.

The MEMS component 110 can be configured for example as a MEMS sound transducer or MEMS microphone. It is pointed out that the explanations below are equally applicable to any MEMS components, such as e.g. also pressure sensors, etc., which are accommodated in a package.

As is furthermore illustrated in FIG. 1, the support component 114 can be arranged or secured e.g. by a nonconductive adhesive 105 on a surface region 104-A of the substrate 104 facing the internal volume, while the MEMS component 110 is furthermore arranged or secured e.g. by a nonconductive adhesive 105 on a surface region 106-A of the cover element 106 facing the internal volume V.

In accordance with one exemplary embodiment, contact pads or metallization pads 114-1 are arranged on the support component 114 on a surface region 114-A that is situated opposite the surface region 110-A of the MEMS component 110 or faces same, said pads being configured (at least regionally) in a mirror-inverted manner with respect to the contact connection pads 110-1 arranged on the surface region 110-A of the MEMS component 110. The contact connection pads 110-1 of the MEMS component 110 are arranged on a surface region 110-A of the MEMS component 110 that is situated opposite or faces the support component 114 (or the surface region 114-A thereof).

Figure 2A:
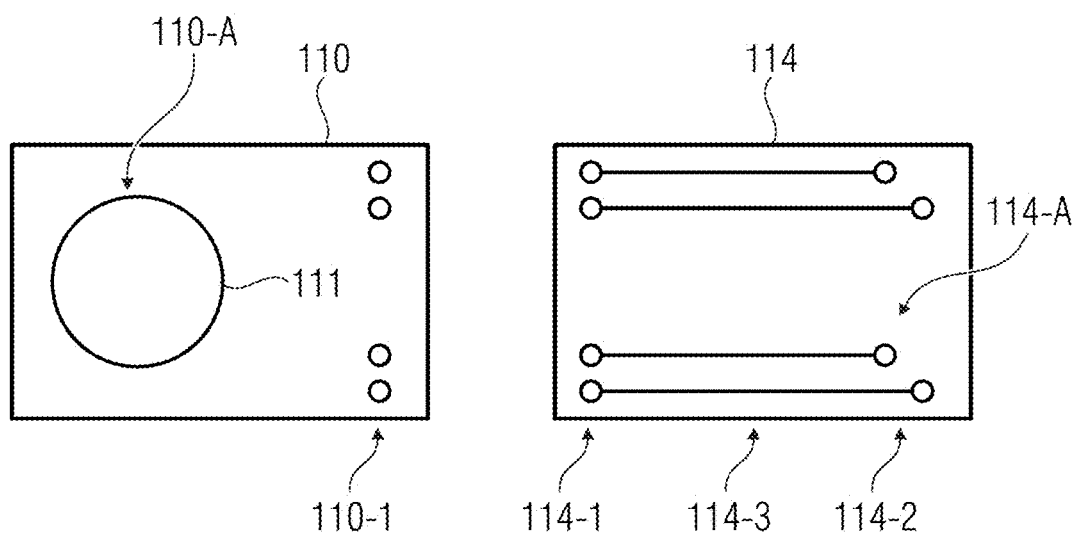
FIGS. 2a-2b show basic illustrations in a plan view of the typical arrangement and configuration of the contact connection pads of MEMS components, of the contact pads of support components and of the connection regions of circuit arrangements in accordance with one exemplary embodiment.
Figure 2B:
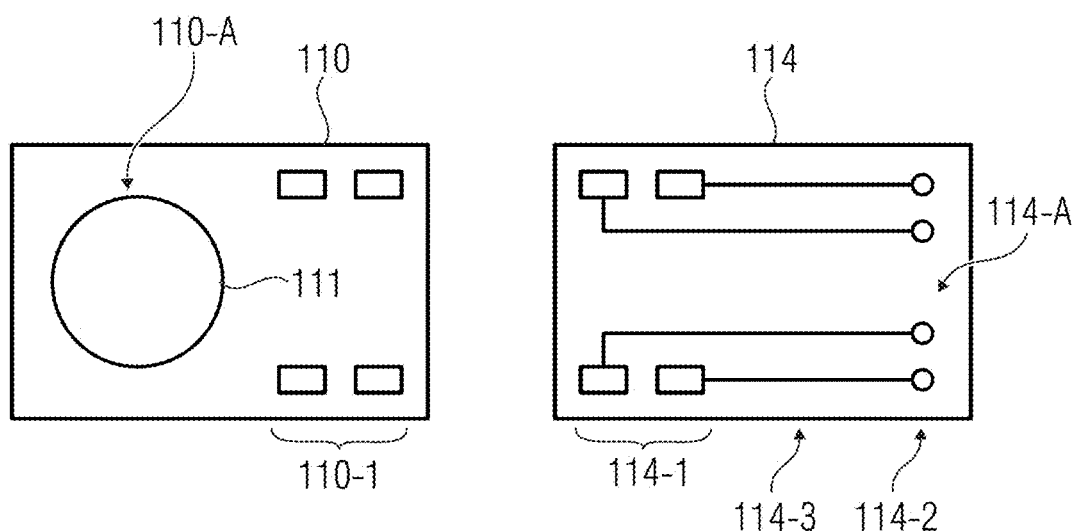

With regard to the configuration and alignment of the contact pads 114-1 on the support component 114 with respect to the contact connection pads 110-1 on the MEMS component 110, reference is furthermore made to the subsequent FIGS. 2a-2b and the description thereof.

In accordance with one exemplary embodiment, the first electrical connection lines 116 between the contact connection pads 110-1 on the MEMS component 110 and the assigned, correspondingly geometrically arranged contact pads 114-1 on the support component 114 are formed by bond wires or metal pins. Consequently, the contact pads 114-1 on the support component 114 can be arranged or configured as so-called landing pads (=landing contact connection pads) on the surface region 114-A of the support component 114 for the first electrical connection lines 116.

Furthermore, it is possible to form the second electrical connection lines 118 between the contact pads 114-1 on the support component 114 by bond wires to the contacting pads 112-1 on the integrated circuit arrangement 112.

The support component 114 can thus be configured as a so-called wiring bridge between the MEMS component 110 and the circuit arrangement 112. Furthermore, what is achieved by the use of the support component 114 is that the contact connection pads 114-1 of the support component 114 are arranged in a manner spaced apart by the thickness or height h114 of the support component 114 from the substrate 104 with the conductor tracks or metallization planes (not shown in FIG. 1) optionally arranged therein, such that parasitic capacitances, e.g. with respect to ground, which are brought about by the first and second electrical connection lines 116, 118, in particular, can be significantly reduced or even avoided.

The MEMS component 110 can thus be configured as a MEMS sound transducer or MEMS microphone comprising one membrane structure or a plurality of membrane structures, e.g. in a dual membrane configuration, and one assigned counterelectrode structure or a plurality of assigned counterelectrode structures, e.g. in a dual backplate configuration (neither being shown in FIG. 1).

In accordance with exemplary embodiments, the MEMS assembly 100 comprises the integrated circuit arrangement 112 (ASIC) in the internal volume V of the package 102 on the substrate 104. The circuit device 112, which is electrically coupled to the MEMS sound transducer 110 electrically via the support component 114 and the first and second connection lines 116, 118, is then configured for example to detect a signal S1 on the basis of a deflection of a membrane structure of the sound transducer 110 relative to a counter-electrode structure, said deflection being brought about by an acoustic sound pressure change ΔP, and to provide a corresponding, conditioned audio output signal S2.

In accordance with one exemplary embodiment, exclusively connection conductor structures for electrically coupling the MEMS component 110 to the circuit device 112 and otherwise no further electrical or electronic components can be arranged on the support component 114. As connection line structures, provision can be made of the contact pads or metallization pads 114-1, 114-2 on the surface region 114-A of the support component 114 and further conductor track structures 114-3 between the contact pads 114-1, 114-2 for electrically coupling the respective first and second electrical connection lines 116, 118, i.e. for respectively connecting the first electrical connection lines 116 arranged on the contact pads 114-1 to the assigned contact pads 114-2 for connection to the second electrical connection lines 118.

In accordance with a further exemplary embodiment, additional active and/or passive circuit elements (not shown in FIG. 1) can furthermore be arranged in the support component 114 besides the contact pads 114-1, 114-2 and connection line structures 114-3. The additional active and/or passive circuit elements in the support component 114 can be arranged for example for the RF coupling of the first and/or second connection lines vis à vis a reference potential, e.g. a ground line in the substrate 104. The substrate 104 can optionally comprise one or more metallization planes 104-1, which can be configured for example as a ground plane and furthermore as one or more signal line planes.

In accordance with one exemplary embodiment, the active and/or passive circuit elements can be provided in the support component 114 for the purpose of providing an ESD functionality (ESD=Electrostatic Discharge) for protection against electrostatic discharges, for example. Furthermore, by way of example, so-called suppressor diodes such as e.g. TAZ diodes (TAZ=Transient Absorption Zener diode) or TVS diodes (TVS=Transient Voltage Suppressor) can be provided, to name just a few possible active circuit elements.

In accordance with one exemplary embodiment, the cover element 106 can be configured to be electrically conductive at least regionally or else completely. In accordance with one exemplary embodiment, the cover element 106 configured to be electrically conductive at least regionally can be electrically connected to a conductive structure 104-1, e.g. a ground plane, in the substrate 104.

In accordance with the exemplary embodiments described, the present concept relates to a novel top port microphone arrangement in which a support component 114 in the form of, for example, an (interposed) silicon chip is used as a wiring bridge, whereby it is possible to avoid an undesired electrical wiring structure at or on the substrate 104 of the package 102, i.e. on the microphone substrate. This approach makes it possible for the same MEMS components (MEMS chips) 110 and the same integrated circuit arrangements 112 (ASIC chips) to be used for both top port and bottom port microphone applications. This construction makes it possible to avoid parasitic capacitances of the electrical connection lines 116, 118 arranged between the MEMS component 110 and the integrated circuit arrangement 112 vis à vis a possible ground plane 104-1 in the substrate 104.

It is thus possible to provide high-performance microphones having a high-impedance electrical path between the MEMS component 110 and the integrated circuit arrangement 112. Furthermore, it is possible to reduce any undesired parasitic capacitances between the electrical connection lines 116, 118 and a reference potential, e.g. ground potential, such that the resulting sensitivity of the MEMS assembly, e.g. of the MEMS microphone, and the resultant overall operating performance of the MEMS component 110 can be increased. The undesired parasitic capacitances can thus be reduced by adding the support component 114, which can be configured e.g. as a silicon support chip, between the electrical connection lines 116, 118 of the MEMS component 110 and the integrated circuit arrangement 112 (ASIC). The support assembly 114 is adhesively bonded or secured to the top side or the surface region 104-A of the substrate by a nonconductive adhesive, for example, and therefore provides for example a sufficient electrical decoupling with respect to the substrate 104 and conduction structures 104-1 possibly arranged therein.

On the basis of the configuration of the MEMS assembly 100 as illustrated by way of example in FIG. 1, substantially the same MEMS components 110 and integrated circuit arrangements 112 can be used for example both for top port MEMS microphone applications and for bottom port MEMS microphone applications, and thus enable a maximum flexibility in the use of these assemblies.

FIGS. 2a-2b then indicate by way of example in a plan view exemplary arrangements of the contact connection pads 110-1 on the MEMS component with the membrane structure 111 there and also the assigned contact pads 114-1, 114-2 of the support component 114, wherein FIGS. 2a-2b make it clear that the contact pads 114-1, e.g. as metallization pads, are arranged on the support component 114 on a surface region 114-A thereof that is situated opposite a surface region 114-A of the MEMS component 110, said pads being configured at least regionally in a mirror-inverted manner with respect to the contact connection pads 110-1 arranged on the surface region 110-A of the MEMS component 110.

In accordance with one exemplary embodiment, the first electrical connection lines 116 between the contact connection pads 110-1 on the MEMS component 110 and the assigned, correspondingly geometrically arranged contact pads 114-1 on the support component 114 are formed by bond wires or metal pins. Consequently, the contact pads 114-1 on the support component 114 can be arranged or configured as so-called landing pads (=landing contact connection pads) on the surface region 114-A of the support component 114 for the first electrical connection lines 116.

In accordance with one exemplary embodiment, contact pads or metallization pads 114-1 are arranged on the support component 114 on a surface region 114-A that is situated opposite the surface region 110-A of the MEMS component 110 or faces same, said pads being configured (at least regionally) in a mirror-inverted manner with respect to the contact connection pads 110-1 arranged on the surface region 110-A of the MEMS component 110. The contact connection pads 110-1 of the MEMS component 110 are arranged on a surface region 110-A of the MEMS component 110 that is situated opposite or faces the support component 114 (or the surface region 114-A thereof).

By contrast, the further contact connection pads 114-2 on the support component 114 can be arranged substantially arbitrarily on the surface region 114-A of the support component 114 and be connected to the assigned contact pads 114-1 via the metallizations or conductor tracks 114-3. In this case, the configuration and arrangement of the contact pads 114-2 can be embodied taking account of the required wire bonding method with the circuit arrangement 112 or the contacting pads 112-1 arranged thereon. Typical dimensions of the contact pads 114-1, 114-2 and contact connection pads 110-1, respectively, can be of an order of magnitude of 50 to 150 µm and approximately 80 µm in the case of a round configuration and can exhibit an edge length of between 50 and 150 µm and of approximately 80 µm in the case of a rectangular configuration.

A basic flow diagram of the method steps of a method 200 for producing a MEMS assembly 100 will now be explained below with reference to FIGS. 3a-3c.

Figure 3A:
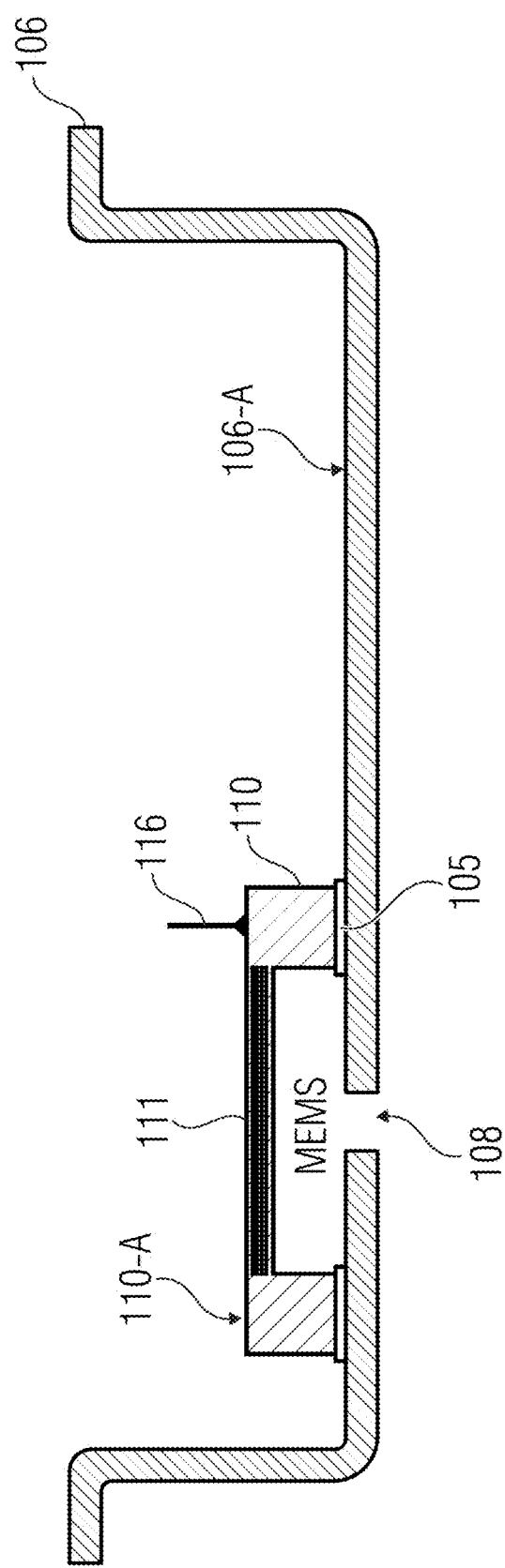
FIGS. 3a-3c show a basic flow diagram of the method steps of a method for producing a MEMS assembly in accordance with one exemplary embodiment.

Firstly, then, as shown in FIG. 3a, in the production method 200, step 210 involves providing a cover element 106 provided with a through opening 108, wherein a MEMS component 110 is arranged on the cover element 106 e.g. adjacent to the through opening 108. Furthermore, electrically conductive connection elements 116, e.g. in the form of bond wire elements (having a sufficient stiffness of the bond wire) or pin elements are arranged on a surface region 110-A of the MEMS component 110, on contact connection pads 110-1 arranged there.

The "lid preparation" thus comprises adhesively bonding the MEMS component 110 onto the cover element 106 (lid) and adding the first electrical connection elements 116, e.g. in the form of one or more vertical bond wires or bond pins. By way of example, four electrical connection elements 116 can be provided, although a different number of connection elements can also be used depending on the application.

Figure 3B:
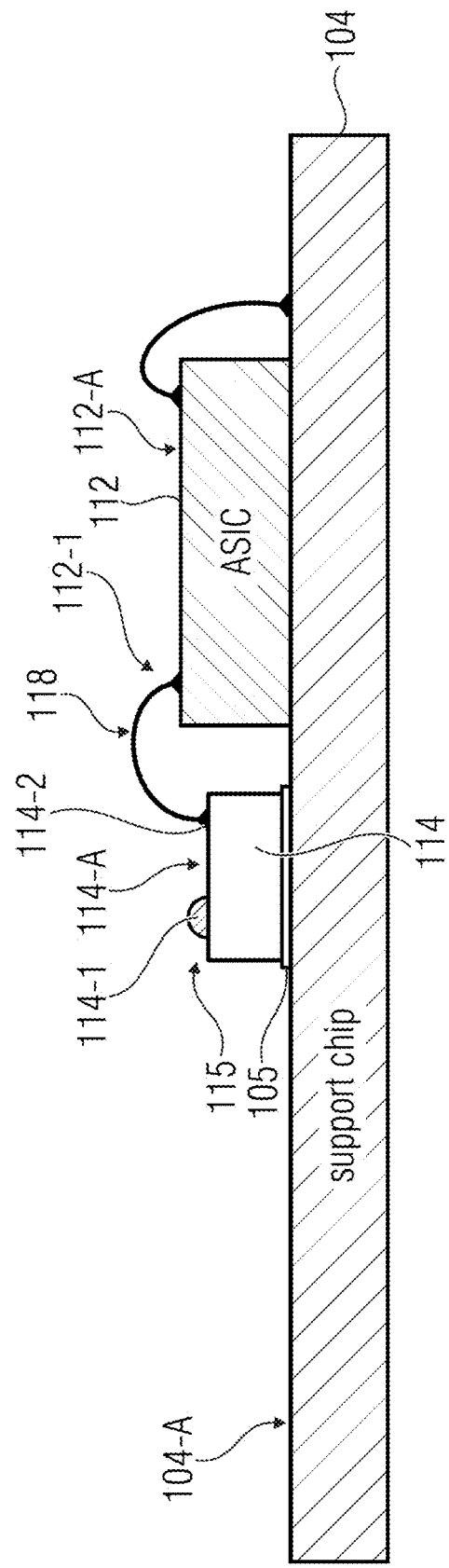

In a step 220 in FIG. 3b, a substrate 104 is then provided, wherein an integrated circuit arrangement 112 (ASIC) and a support component 114 are arranged on the substrate 104, wherein the integrated circuit arrangement 112 is electrically connected via connection elements 116, configured for example as bond wires, to the support component 114 or the contact pads 114-2 arranged thereon. As is illustrated in FIG. 3b, by way of example, a conductive adhesive or adhesive drop 115, provided for the subsequent connection to the connection elements 116, can be situated on contact pads 114-1 of the support component 114. Furthermore, the support component 114 can comprise, for example, a semiconductor material, such as e.g. a silicon material, which comprises, as metallization pads or contact pads 114-1, 114-2 and conduction structures 114-3, a metal coat, e.g. a gold coat (as a gold plating), as is also the case, for example, for the contacting pads 112-1 of the integrated circuit arrangement 112.

The substrate preparation comprises for example adhesively bonding the integrated circuit arrangement 112 and the support component 114 on the substrate, wherein second electrical connection elements 118, e.g. as bond wires, are arranged between the contacting pads 112-1 of the integrated circuit arrangement 112 and the contact pads 114-2 of the support component, wherein a conductive adhesive material or adhesive balls 115 are furthermore arranged on the so-called landing points, i.e. the contact pads 114-1 on the support component 114.

Figure 3C:
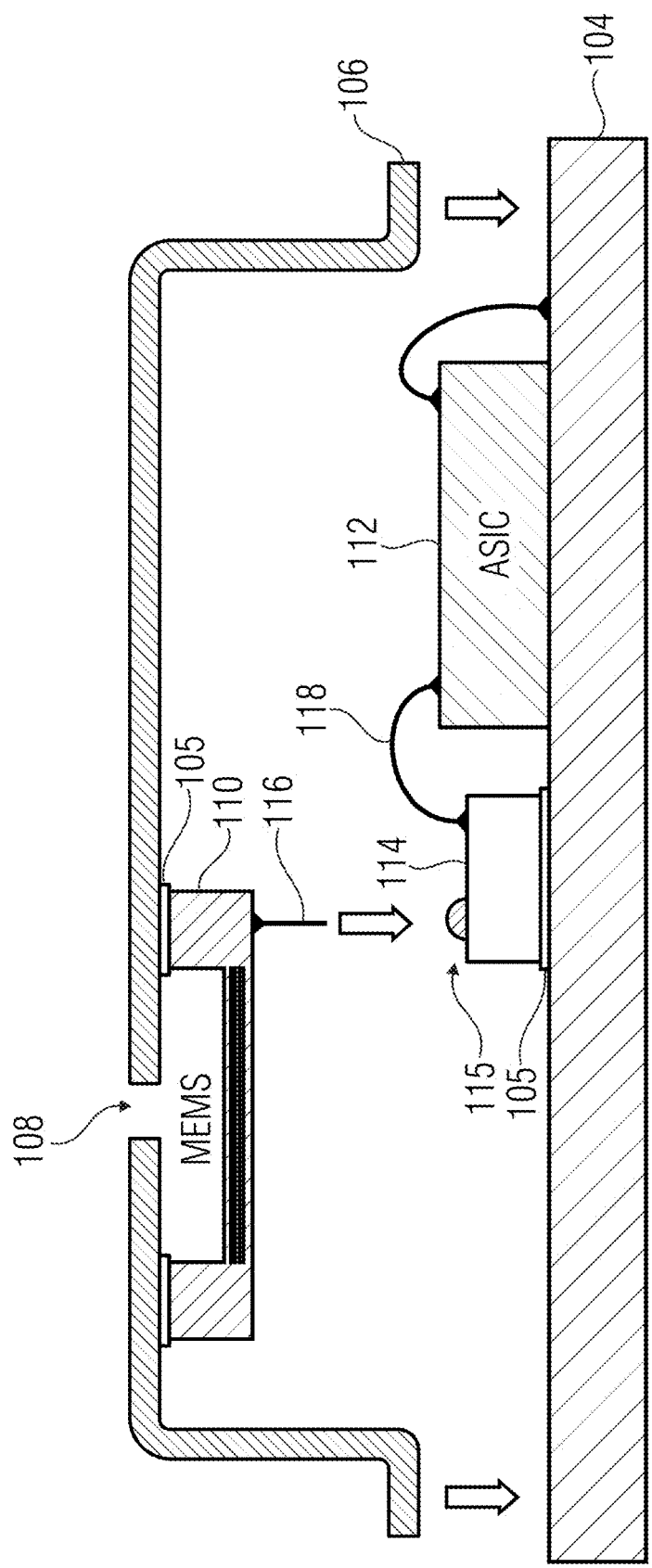

In step 230 illustrated in FIG. 3c, the cover element 106 is then mechanically and optionally also electrically connected to the substrate 104 in order to form a package 102 having an internal volume V, wherein in step 230 of connecting, an electrical coupling between the contact connection pads 110-1 of the MEMS component 110 and the contact pads 114-1 of the support component 114 is furthermore produced in the internal volume V via the first connection elements 116, e.g. bond wires or bond pins. For this purpose, the electrical connection elements 116 are introduced for example into the conductive adhesive material 115 arranged on the contact pads 114-1 of the support component 114, said adhesive material, upon subsequent curing thereof, providing for a mechanical and electrical connection of the first electrical connection elements 116 also to the contact pads 114-1 on the support component 114.

Furthermore, by way of example, an adhesive or a solder can be used to obtain the mechanical connection between the cover element 106 and the substrate 104. If the intention is furthermore to produce an electrical connection between the cover element 106 and the substrate 104 or wiring planes 104-1 arranged therein, the adhesive or the solder is configured to be electrically conductive and is arranged on corresponding substrate contact pads (not shown).

In step 230 of "lid securing", therefore, the support assembly 114 arranged on the substrate 104 is electrically coupled, by the first electrical connection elements 116, to the MEMS component 110 arranged on the cover element 106, wherein, by the second electrical connection elements 118, the support component 114 has already been connected to the integrated circuit arrangement 112 arranged on the substrate 104, such that an electrical connection or coupling between the MEMS component 110 and the integrated circuit arrangement 112 is provided.

From the above description of the method 200 comprising the exemplary method steps 210, 220 and 230, it should become clear that this constitutes merely a basic and greatly simplified explanation of the procedure for producing the MEMS assembly 100 since, for example, even further intermediate steps for taking account of further process steps, which are not essential to the present concept, however, can be carried out.

In accordance with one exemplary embodiment, before the step of connecting 230, then, the contact pads 114-1 on the support component 114 are arranged or aligned at least regionally opposite the contact connection pads 110-1 on the MEMS component 110. The contact pads 114-1 on the support component 114 are thus arranged or aligned at least regionally or completely in a mirror-inverted manner with respect to the contact connection pads 110-1 arranged on the MEMS component 110.

In accordance with one exemplary embodiment, in step 230 of connecting, the electrical coupling or the electrical connections between the contact connection pads 110-1 on the MEMS component 110 and the assigned, correspondingly geometrically arranged contact pads 114-1 on the support component 114 is/are obtained by bond wires, bond pins or metal pins. The contact pads 114-1 on the support component 114 are thus configured as landing pads for connection elements 116 on the surface region 114-A of the support component 114.

An "opposite configuration or embodiment" is equally possible, wherein the electrical connection lines 116 are configured in the form of bond wires, bond pins and/or metal pins on the surface region 114-A, there on the contact pads 114-1 of the support component 114, wherein the conductive adhesive material or the conductive adhesive balls 115 (in a non-cured state) is/are then arranged on the contact connection pads 110-1 of the MEMS component 110, and the contact connection pads 110-1 on the MEMS component 110 are thus configured as the landing pads for the electrical connection elements 116 on the surface region 110-A of the MEMS component 110.

In accordance with one exemplary embodiment, therefore, the support component 114 is configured as a wiring bridge between the MEMS component 110 and the integrated circuit arrangement 112.

As is illustrated by way of example in FIG. 3c, the height $h_{114}$ of the support component 114 is somewhat smaller than the height $h_{112}$ of the integrated circuit arrangement 112. In accordance with exemplary embodiments, the heights $h_{114}$ and $h_{112}$ can also be configured to be equal in magnitude, wherein the height $h_{114}$ can also be configured to be greater than the height $h_{112}$, depending on the requirements of the respective configuration of the MEMS assembly 100.

In accordance with one exemplary embodiment, therefore, in the step of connecting 230, the integrated circuit arrangement 112 is electrically coupled to the MEMS component 110 via the support component 114.

Some substantive matter and functions of the present MEMS assembly 100 and of the method 200 for producing the MEMS assembly 100 will now be explained once again by way of example below.

In accordance with exemplary embodiments, therefore, a top port microphone 100 is formed with an additional support component 114 as a so-called wiring bridge. The MEMS component 110 arranged on the cover 106 (also called lid) is connected via the support assembly 114, also called support chip, to the integrated circuit arrangement 112 (ASIC) within the package 102. The support assembly has, on its top side 114-A, contact pads or metallization pads 114-1, which are configured in a mirror-inverted manner with respect to the contact connection pads 110-1 arranged on the MEMS component and serve as so-called landing pads on the surface region 114-A of the support component 114. A plurality of electrical connection elements 116, e.g. in the form of pins or bond wires formed sufficiently rigidly, form the electrical connection 116 between the contact connection pads 110-1 on the MEMS component 110 and the assigned, correspondingly geometrically arranged landing contact pads (landing pads) 114-1 on the support component 114. In accordance with one exemplary embodiment, the support component has 110 further electrical and/or electronic functionality.

In accordance with further exemplary embodiments, additional active and/or passive circuit elements, such as e.g. preamplifiers, etc., can be arranged in the support component 114 in order to separate this electronic functionality from the integrated circuit arrangement 112, i.e. the ASIC chip, and to transfer it to the support component, with the result that, for example, the complexity of the integrated circuit arrangement 112 can be reduced or additional electrical and/or electronic functionalities not made available on the integrated circuit arrangement 112, such as e.g. amplification properties, filter properties, etc., can be carried out on the output signal S1 of the MEMS component 110 by the support chip 114. Furthermore, in accordance with exemplary embodiments, circuitry measures can be implemented in order also to obtain RF properties such as e.g. an RF coupling to the electrical line elements 116, 118. Furthermore, in accordance with exemplary embodiments, it is possible to implement circuit elements for ESD protection on the support component.

It is thus possible to provide a modular configuration of the support component 114 and of the associated integrated circuit arrangement 112 and also optionally of the MEMS component 110.

Since the contact connection pads 110-1 of the MEMS component 110, e.g. for insulation reasons, are provided at the corners of the MEMS component 110, corresponding geometric restrictions arise for the configuration of the contact pads 114-1 on the support component 114, which are provided in a relatively exactly aligned manner geometrically with the contact connection pads 110-1 on the MEMS component 110 for receiving the contact pins 116 for reliable electrical connection.

Typical dimensions for a MEMS component 110 (MEMS chip) currently exhibit an edge length of 1.5 to 2.5 mm and approximately 1.9 mm, while an integrated circuit arrangement 112 (HSEC) has for example an edge length of 0.5 to 1 mm and of approximately 0.8 mm, wherein this corresponds to current designs for MEMS components 110 and integrated circuit arrangements 112. The MEMS contact connection pads 110-1 (contact pads) have for example an edge length of 50 to 150 µm and of approximately 18 µm, wherein a tolerance range for the contacting of a maximum of ±10 µm should be complied with.

The pins 116 can be arranged for example on the contact connection pads 110-1 of the MEMS component 110, and upon the joining together of the package 102, i.e. of the lid 106 with the substrate 104, which is configured for example as a PCB (PCB=Printed Circuit Board), can be connected by a conductive adhesive drop arranged on the contact pads 114-1 of the support component 114.

Alternatively, one possible procedure comprises providing the contact pins 116 fixedly on the contact pads 114-1 of the support component, and, upon the joining together of the substrate 104 with the lid element 106, in producing the adhesive connection between the contact pins 116 and the contact connection pads 110-1 of the MEMS component 110, said contact connection pads being provided with a conductive adhesive material.

In accordance with exemplary embodiments of the present concept, it can thus be stated in summary that the support component 114 is provided in order to provide a wiring bridge between the MEMS component 110 and the integrated circuit arrangement 112, wherein it is possible in particular to eliminate parasitic effects in comparison with conventional procedures in which, for example, the contact pins or connection lines extend as far as the surface of the substrate 104.

In accordance with one exemplary embodiment, active and/or passive circuit parts of the integrated circuit arrangement 112 (ASIC) can be transferred to the support component 114, such that, for example, modular functions or assemblies for specific design series of integrated circuit arrangements (ASICs) can be provided by the support component.

A further possibility for application of the support component 114 as a wiring bridge furthermore resides in the fact that the same MEMS components 110 and also integrated circuit arrangements 112 can be used both in the case of top port microphones and in the case of bottom port microphones, that is to say that there is no need for specifically designed elements for the two different types of microphone.

In accordance with one exemplary embodiment, a MEMS assembly 100 comprises the following features: a package 102, wherein the package 102 comprises a substrate 104 and a cover element 106 arranged thereon, wherein a through opening 108 is provided in the cover element 106, a MEMS component 110 arranged within the package 102 on the cover element 106, an integrated circuit arrangement 112 arranged within the package 102 on the substrate 104, and a support component 114 arranged within the package 102 on the substrate 104, wherein the support component 114 arranged on the substrate 104 is electrically coupled, by first electrical connection lines 116, to the MEMS component 110 arranged on the cover element 106 and is furthermore electrically coupled, by second electrical connection lines 118, to the circuit arrangement 112 arranged on the substrate 104 in order to produce an electrical connection between the MEMS component 110 and the integrated circuit arrangement 112.

In accordance with one exemplary embodiment, contact pads 114-1 are arranged on a surface region 114-A of the support component 114 that is situated opposite a surface region 110-A of the MEMS component 110, said contact pads being configured at least regionally in a mirror-inverted fashion with respect to the contact connection pads 110-1 arranged on the surface region 110-A of the MEMS component 110.

In accordance with one exemplary embodiment, the first electrical connection lines 116 between the contact connection pads 110-1 on the MEMS component 110 and the assigned contact pads 114-1 on the support component 114 comprise bond wires or metal pins.

In accordance with one exemplary embodiment, the support component 114 is configured as a wiring bridge between the MEMS component 110 and the integrated circuit arrangement 112.

In accordance with one exemplary embodiment, the MEMS component 114 is configured as a MEMS sound transducer or MEMS microphone comprising a membrane structure and an assigned counterelectrode structure.

In accordance with one exemplary embodiment, the integrated circuit arrangement 112 is electrically coupled to the MEMS component 110 via the support component 114, wherein the integrated circuit device 112 is configured to detect an output signal S1 of the MEMS component 110 that is based on a deflection of a membrane structure relative to an electrode structure of the MEMS component 110, said deflection being brought about as a result of an acoustic sound pressure change $\Delta P$.

In accordance with one exemplary embodiment, exclusively the contact pads 114-1, 114-2 and connection line structures 114-3 for electrically coupling the MEMS component 110 to the integrated circuit arrangement 112 are arranged on the support component 114.

In accordance with one exemplary embodiment, additional active and/or passive circuit elements are furthermore arranged in the support component 114 besides the contact pads 114-1, 114-2 and connection line structures 114-3.

In accordance with one exemplary embodiment, in the support component 114 the active and/or passive circuit elements are arranged for the purpose of the RF coupling of the first and second electrical connection line elements 116, 118 vis à vis the substrate.

In accordance with one exemplary embodiment, in the support component 114 active and/or passive circuit elements are arranged for the purpose of providing an ESD functionality of the connection line structures vis à vis the substrate 104.

In accordance with one exemplary embodiment, the cover element 106 is configured to be electrically conductive at least regionally.

In accordance with one exemplary embodiment, the cover element 106 is configured to be electrically conductive and is electrically connected to a conductive structure 104-1 on the substrate 104.

In accordance with one exemplary embodiment, the MEMS component 110 is arranged adjacent to the through opening 108 or in a manner spanning the through opening 108 in the package 102.

In accordance with one exemplary embodiment, a method 200 for producing a MEMS assembly 100 comprises the following steps: providing 210 a cover element 106 provided with a through opening 108, wherein a MEMS component 110 is arranged on the cover element 106, providing a substrate 104, wherein an integrated circuit arrangement 112 and a support component 114 are arranged on the substrate 104, wherein the integrated circuit arrangement 112 is electrically coupled to the support component 114 via second electrical connection elements 118, and connecting 230 the cover element 106 to the substrate 104 in order to form a package 102 having an internal volume V and in order to produce an electrical connection between the MEMS component 110 and the support component 114 in the internal volume V via first electrical connection elements 116, wherein the support component 114 arranged on the substrate 104 is electrically coupled, by the first electrical connection elements, to the MEMS component arranged on the cover element 106, and wherein the support component 114 is furthermore electrically coupled, by the second electrical connection elements 118, to the integrated circuit arrangement 112 arranged on the substrate 104 in order to provide an electrical connection between the MEMS component 110 and the integrated circuit arrangement 112.

In accordance with one exemplary embodiment, the method 200 furthermore comprises the following step: before the step of connecting 230, aligning contact pads 114-1 on the support component 114 at least regionally opposite contact connection pads 110-1 on the MEMS component 110, wherein the contact pads 114-1 on the support component 114 are arranged at least regionally in a mirror-inverted manner with respect to the contact connection pads 110-1 arranged on the MEMS component 110.

In accordance with one exemplary embodiment, in the step of connecting 230, the electrical coupling between the contact connection pads 110-1 on the MEMS component 110 and the assigned contact pads 114-1 on the support component 114 is obtained by bond wires or metal pins.

In accordance with one exemplary embodiment, the support component 114 is configured as a wiring bridge between the MEMS component 110 and the integrated circuit arrangement 112.

In accordance with one exemplary embodiment, in the step of connecting 230 the integrated circuit arrangement 112 is electrically coupled to the MEMS component via the support component 114.

Although some aspects of the present disclosure have been described as features in the context of a device, it is clear that such a description can likewise be regarded as a description of corresponding method features. Although some aspects have been described as features in association with a method, it is clear that such a description can also be regarded as a description of corresponding features of a device or of the functionality of a device.

In the detailed description above, in some instances different features have been grouped together in examples in order to rationalize the disclosure. This type of disclosure ought not to be interpreted as the intention that the claimed examples have more features than are expressly indicated in each claim. Rather, as represented by the following claims, the subject matter can reside in fewer than all features of an individual example disclosed. Consequently, the claims that follow are hereby incorporated in the detailed description, wherein each claim can be representative of a dedicated separate example. While each claim can be representative of a dedicated separate example, it should be noted that although dependent claims refer back in the claims to a specific combination with one or more other claims, other examples also comprise a combination of dependent claims with the subject matter of any other dependent claim or a combination of each feature with other dependent or independent claims. Such combinations shall be encompassed, unless an explanation is given that a specific combination is not intended. Furthermore, the intention is for a combination of features of a claim with any other independent claim also to be encompassed, even if this claim is not directly dependent on the independent claim.

Although specific exemplary embodiments have been illustrated and described herein, it will be apparent to a person skilled in the art that a multiplicity of alternative and/or equivalent implementations can be substituted for the specific exemplary embodiments shown and illustrated there, without departing from the subject matter of the present application. This application text is intended to cover all adaptations and variations of the specific exemplary embodiments discussed and described herein. Therefore, the present subject matter of the application is limited only by the wording of the claims and the equivalent embodiments thereof.

What is claimed is:

1. A MEMS assembly comprising:
a package, wherein the package comprises a substrate and a cover element arranged thereon, wherein a through opening is provided in the cover element;
a MEMS component arranged within the package on the cover element;
an integrated circuit arrangement arranged within the package on the substrate, the integrated circuit arrangement having a first surface facing the substrate and a second surface opposite the first surface; and
a support component arranged within the package on the substrate, the support component having a first surface facing the substrate and a second surface opposite the first surface,
wherein the support component arranged on the substrate is electrically coupled, by first electrical connection lines, to the MEMS component arranged on the cover element and is furthermore electrically coupled, by second electrical connection lines, to the integrated circuit arrangement arranged on the substrate in order to produce an electrical connection between the MEMS component and the integrated circuit arrangement, wherein the second electrical connection lines are coupled between contact connection pads disposed on the second surface of the support component and contact connection pads disposed on the second surface of the integrated circuit arrangement.

2. The MEMS assembly as claimed in claim 1, wherein contact pads arranged on the second surface of the support component are situated opposite a surface region of the MEMS component, said contact pads being configured at least regionally in a mirror-inverted fashion with respect to contact pads arranged on the surface region of the MEMS component.

3. The MEMS assembly as claimed in claim 2, wherein the first electrical connection lines between the contact pads on the MEMS component and the contact pads on the second surface of the support component comprise bond wires or metal pins.

4. The MEMS assembly as claimed in claim 1, wherein the support component is configured as a wiring bridge between the MEMS component and the integrated circuit arrangement.

5. The MEMS assembly as claimed in claim 1, wherein the MEMS component is configured as a MEMS sound transducer or MEMS microphone comprising a membrane structure and an assigned counterelectrode structure.

6. The MEMS assembly as claimed in claim 1, wherein the integrated circuit arrangement is electrically coupled to the MEMS component via the support component, and wherein the integrated circuit arrangement is configured to detect an output signal of the MEMS component that is based on a deflection of a membrane structure relative to an electrode structure of the MEMS component, said deflection being brought about as a result of an acoustic sound pressure change $\Delta P$.

7. The MEMS assembly as claimed in of claim 1, wherein additional active and/or passive circuit elements are furthermore arranged in the support component besides the contact connection pads, the first electrical connection lines, and the second electrical connection lines.

8. The MEMS assembly as claimed in claim 7, wherein in the support component, the active and/or passive circuit elements are arranged for RF coupling of the first and second electrical connection lines vis à vis the substrate.

9. The MEMS assembly as claimed in claim 7, wherein in the support component active and/or passive circuit elements are arranged for providing an ESD functionality of the first and second electrical connection lines vis à vis the substrate.

10. The MEMS assembly as claimed in claim 1, wherein the cover element is configured to be electrically conductive at least regionally.

11. The MEMS assembly as claimed in claim 1, wherein the cover element is configured to be electrically conductive and is electrically connected to a conductive structure on the substrate.

12. The MEMS assembly as claimed in claim 1, wherein the MEMS component is arranged adjacent to the through opening or in a manner spanning the through opening in the package.

13. A method for producing a MEMS assembly, the method comprising:
providing a cover element provided with a through opening, wherein a MEMS component is arranged on the cover element;
providing a substrate, wherein an integrated circuit arrangement and a support component are arranged on the substrate, wherein the integrated circuit arrangement comprises a first surface facing the substrate and a second surface opposite the first surface, the support component comprises a first surface facing the substrate and a second surface opposite the first surface, and the integrated circuit arrangement is electrically coupled to the support component via second electrical connection elements coupled between contact connection pads disposed on the second surface of the of the integrated circuit arrangement and contact connection pads disposed on the second surface of the support component; and
connecting the cover element to the substrate in order to form a package having an internal volume and in order to produce an electrical connection between the MEMS component and the support component in the internal volume via first electrical connection elements,
wherein the support component arranged on the substrate is electrically coupled, by the first electrical connection elements, to the MEMS component arranged on the cover element, and wherein the support component is furthermore electrically coupled, by the second electrical connection elements, to the integrated circuit arrangement arranged on the substrate in order to provide an electrical connection between the MEMS component and the integrated circuit arrangement.

14. The method as claimed in claim 13, further comprising:
before the step of connecting, aligning contact pads on the support component at least regionally opposite contact pads on the MEMS component,
wherein the contact pads on the support component are arranged at least regionally in a mirror-inverted manner with respect to the contact connection pads arranged on the MEMS component.

15. The method as claimed in claim 13, wherein the first electrical connection elements comprise bond wires or metal pins.

16. The method as claimed in claim 13, wherein the support component is configured as a wiring bridge between the MEMS component and the integrated circuit arrangement.

17. The method as claimed in claim 13, wherein the integrated circuit arrangement is electrically coupled to the MEMS component via the support component.

18. A MEMS assembly comprising:
a package, wherein the package comprises a substrate and a cover element arranged thereon, wherein a through opening is provided in the cover element;
a MEMS component arranged within the package on the cover element;
an integrated circuit arrangement arranged within the package on the substrate; and
a support component arranged within the package on the substrate,
wherein the support component arranged on the substrate is electrically coupled, by first electrical connection lines, to the MEMS component arranged on the cover element and is furthermore electrically coupled, by second electrical connection lines, to the integrated circuit arrangement arranged on the substrate in order to produce an electrical connection between the MEMS component and the integrated circuit arrangement, wherein additional active and/or passive circuit elements are furthermore arranged in the support component besides contact connection pads, the first electrical connection lines, and the second electrical connection lines.

19. The MEMS assembly as claimed in claim 1, wherein the second electrical connection lines comprise bond wires.

20. The method as claimed in claim 13, wherein the second electrical connection elements comprise bond wires.

* * * * *